(12) United States Patent
Sweeney et al.

(10) Patent No.: US 7,109,830 B2
(45) Date of Patent: Sep. 19, 2006

(54) LOW COST HIGHLY ISOLATED RF COUPLER

(75) Inventors: Richard Emil Sweeney, Rancho Santa Margarita, CA (US); Jason E. Snodgress, Cameron Park, CA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 322 days.

(21) Appl. No.: 10/227,687

(22) Filed: Aug. 26, 2002

(65) Prior Publication Data

US 2004/0037062 A1 Feb. 26, 2004

(51) Int. Cl.
*H01P 3/08* (2006.01)
*H01P 1/00* (2006.01)

(52) U.S. Cl. .................... 333/246; 333/260

(58) Field of Classification Search ............ 174/35 R, 174/35 G, 255, 250, 260; 361/816, 818, 361/748, 760, 761, 762; 333/246, 260
See application file for complete search history.

(56) References Cited

U.S. PATENT DOCUMENTS

| | | | |
|---|---|---|---|
| 4,019,141 A | 4/1977 | Numan et al. ............... 325/357 |
| 4,041,399 A | 8/1977 | Tsuda ........................ 325/357 |
| 4,091,343 A | 5/1978 | Knox et al. .................. 333/10 |
| 4,216,446 A | 8/1980 | Iwer ........................... 333/112 |
| 4,288,761 A | 9/1981 | Hopfer ........................ 333/116 |
| 4,352,209 A | 9/1982 | Ma ............................ 455/315 |
| 4,370,515 A | 1/1983 | Donaldson ................... 174/35 |
| 4,370,700 A | 1/1983 | Duddles et al. .............. 361/424 |
| 4,404,617 A | 9/1983 | Ohyama et al. ............. 361/424 |
| 4,494,095 A | 1/1985 | Noji et al. .................... 334/85 |
| 4,661,998 A | 4/1987 | Yamashita et al. .......... 455/315 |
| 4,723,307 A | 2/1988 | Clark et al. ................. 455/103 |
| 4,739,453 A | 4/1988 | Kurokawa ................... 361/424 |
| 4,754,101 A | 6/1988 | Stickney et al. .............. 174/35 |
| 4,758,922 A * | 7/1988 | Ishigaki et al. ............. 361/330 |
| 4,800,464 A | 1/1989 | Roos et al. .................. 361/424 |
| 5,107,404 A | 4/1992 | Tam ........................... 361/424 |
| 5,159,298 A | 10/1992 | Dydyk ........................ 333/112 |
| 5,160,807 A | 11/1992 | Fry et al. ...................... 174/35 |
| 5,369,379 A | 11/1994 | Fujiki ......................... 333/116 |
| 5,475,876 A | 12/1995 | Terada et al. ............... 455/301 |
| 5,487,184 A | 1/1996 | Nagode ...................... 455/126 |
| 5,666,090 A | 9/1997 | Tsuruoka .................... 333/116 |

(Continued)

FOREIGN PATENT DOCUMENTS

EP 0407072 1/1991

(Continued)

OTHER PUBLICATIONS

Sheleg, B. et al., article entitled, "Broad-Band Directional Couplers Using Microstrip With Dielectric Overlays," IEEE, vol. MTT-22, No. 12, Dec. 1974.

(Continued)

*Primary Examiner*—Hung V. Ngo
(74) *Attorney, Agent, or Firm*—David L. Henty; Myers Dawes Andras & Sherman LLP

(57) ABSTRACT

Methods of assembling a coupler are provided in which a first printed circuit board is provided, and a second printed circuit board is then surface mounted on the first printed circuit board. The first printed circuit board and the second printed circuit board are then electrically and mechanically connected to provide a coupler having a shielded region defined between the first printed circuit board and the second printed circuit board. The shielded region at least partly surrounds a coupler circuit disposed therein.

26 Claims, 5 Drawing Sheets

U.S. PATENT DOCUMENTS

| | | | |
|---|---|---|---|
| 5,689,217 A | 11/1997 | Gu et al. | 333/116 |
| 5,841,328 A | 11/1998 | Hayashi | 333/116 |
| 5,995,821 A | 11/1999 | Tran | 455/345 |
| 6,018,279 A | 1/2000 | Arthur | 333/116 |
| 6,160,571 A | 12/2000 | Wang | 348/10 |
| 6,342,681 B1 | 1/2002 | Goldberger et al. | 174/261 |
| 6,353,189 B1 * | 3/2002 | Shimada et al. | 174/255 |
| 6,353,540 B1 * | 3/2002 | Akiba et al. | 361/794 |
| 6,777,620 B1 * | 8/2004 | Abe | 174/255 |

FOREIGN PATENT DOCUMENTS

| | | |
|---|---|---|
| EP | 1089336 | 4/2001 |
| WO | WO 2004097974 A1 * | 11/2004 |

OTHER PUBLICATIONS

Podell, A., article entitled "A High Directivity Microstrip Coupler Technique," pp. 32-37.

Article entitled, "Microstrip Couplers with Improved Directivity," *Electronics Letters* 2$^{nd}$ Feb. 1978, vol. 14, No. 3.

\* cited by examiner

LOW COST HIGHLY ISOLATED RF COUPLER

BACKGROUND OF THE INVENTION

The present invention generally relates to RF couplers, and more particularly relates to highly isolated RF couplers.

Conventional RF couplers that can provide a high degree of isolation typically include connectorized couplers, couplers within isolated compartments, or couplers within multi-layer structures. Such couplers typically employ of bulky, space consuming shielding such as surface mounted isolation walls, shielding cans, enclosures or other housings that are typically placed over the coupler circuit in order to achieve a high degree of isolation. Such couplers are discussed in, for example, a copending U.S. application Ser. No. 10/103,277 entitled "A SYSTEM AND METHOD OF PROVIDING HIGHLY ISOLATED RADIO FREQUENCY INTERCONNECTIONS", which is incorporated by reference in its entirety herein.

In many circumstances, however, it is not possible or desirable to use such couplers due to cost, space constraints, or other manufacturing considerations such as the significant amount of time required to install such couplers.

Accordingly, there is a need for low cost RF couplers that are compact yet highly isolated. Ideally such RF couplers would be easily manufacturable in that they do not require extensive hand assembly to produce. It would be highly desirable if such RF couplers were easily integrateable with modem manufacturing techniques and would allow for cost efficient manufacturing.

SUMMARY OF THE PREFERRED EMBODIMENTS

An aspect of the present invention provides methods of assembling a coupler. A base printed circuit board is provided. A surface mount printed circuit board is then mounted on the base printed circuit board such that a shielded region is defined between the base printed circuit board and the surface mount printed circuit board. The shielded region at least partly surrounds a coupler circuit disposed therein.

Another aspect of the present invention provides coupler assemblies that include a first printed circuit board, and a second printed circuit board surface mounted on the first printed circuit board. A shielded region is defined between the first printed circuit board and the second printed circuit board such that the shielded region at least partly surrounds a coupler circuit disposed therein.

BRIEF DESCRIPTION OF DRAWINGS

The following discussion may be best understood with reference to the various views of the drawings, described in summary below, which form a part of this disclosure.

DETAILED DESCRIPTION OF THE PREFERRED EMBODIMENTS

Figure 1:
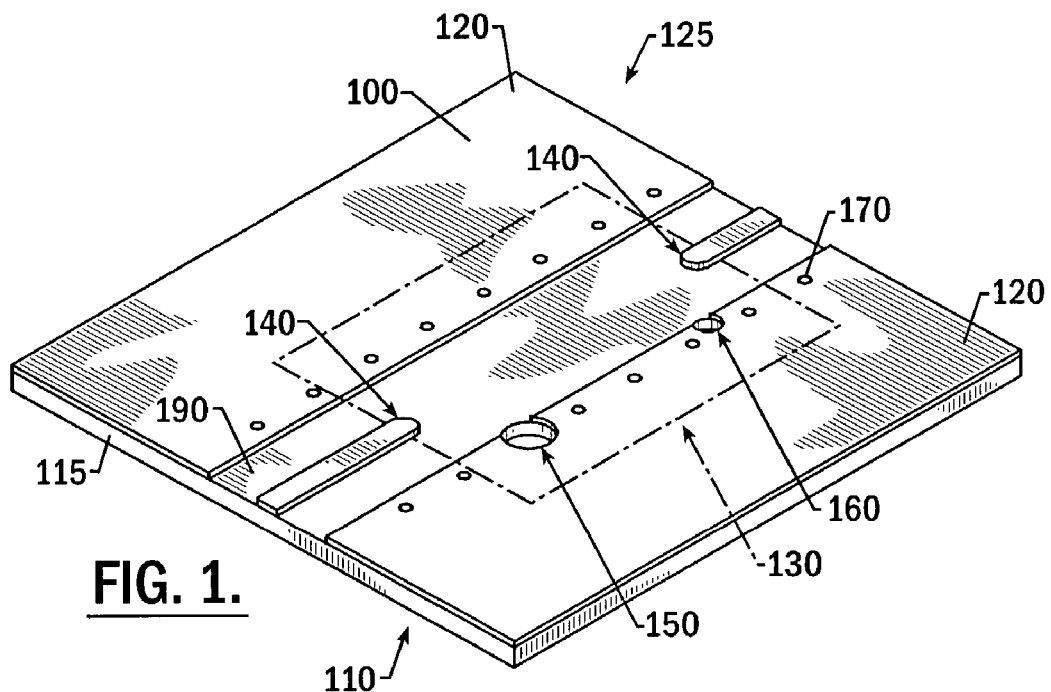
FIG. 1 illustrates an example of a base PCB structure that can be used to implement aspects of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the size of functional units are exaggerated for clarity. Like numbers refer to like elements throughout.

It will be understood that when an element such as a circuit, structure, region, board or area is referred to as being "connected to" another element, it can be directly connected to the other element or intervening elements may also be present. In contrast, when an element is referred to as being "directly connected to" another element, there are no intervening elements present. When an element such as a circuit, structure, region, board or area is referred to as being "adjacent" or "proximate" another element, it can be near the other element but not necessarily independent of the other element. When an element such as a circuit, structure, region, board or area is referred to as being "between" two things, it can be either partly of completely between those two things, but is not necessarily completely and continuously between those two things. The term "adapted to" should be construed to mean "capable of".

The term stripline generally denotes a structure comprising a signal conducting strip and two ground planes which extend considerably in transverse directions. The space between the ground planes is filled with a dielectric medium and the central strip is embedded in this dielectric. The ground planes are at zero RF potential relative to each other. Stripline is compatible with automated Surface Mount Technology (SMT) assembly process flows.

By contrast, the term microstrip generally denotes an unshielded transmission line comprising a single dielectric substrate with ground plane on one side and a signal conducting strip on the other face. Unlike stripline, SMT components can be attached directly to the signal conducting top layer of microstrip. However, microstrip is also generally subject to Electromagnetic Interference (EMI) from nearby conductors because of its unshielded structure.

Practice of preferred aspects of the present invention can provide couplers exhibiting a stripline structure yet that can provide the directivity offered by microstrip applications.

Aspects of the present invention relate to placement of an RF coupler in an area that requires a high level of isolation at a low cost. Aspects of the present invention can provide for a compact RF coupler design, while maintaining the radiated isolation shielding. Aspects of the present invention can also provide compact coupler assemblies that take up less space and that can therefore greatly expand the number and type of integration options. As a result, the integration density offered by such couplers can be vastly increased, thereby allowing for increased miniturаization. Aspects of the present invention can also provide coupler assemblies that can also significantly decrease the cost of the coupler in comparison to more expensive connectorized couplers and/or couplers having separate isolation walls soldered to the PCB. In addition, manufacture of such coupler assemblies is much easier since less labor is involved.

Aspects of the present invention can provide coupler assemblies comprising a first printed circuit board, a second printed circuit board, and a shielded region. The second printed circuit board can be surface mounted on the first printed circuit board. The shielded region can defined between the first printed circuit board and the second printed circuit board such that the shielded region at least partly surrounds a coupler circuit disposed therein.

In some embodiments, the first printed circuit board can a first etchback area, and the second printed circuit board can include a second etchback area. The shielded region can then be defined, for example, between the first etchback area and the second etchback area. The coupler circuit can then be disposed in at least one of the first etchback area and the second etchback area. The shielded region is preferably at least partly filled with a dielectric material.

The coupler circuit may include, for example, a first RF structure, a second RF structure, and a transition region. The second RF structure is coupled to the first RF structure. The first RF structure can be disposed on at least one of the first printed circuit board and the second printed circuit board. The second RF structure can be disposed proximate the first RF structure on at least one of the first printed circuit board and the second printed circuit board. The second RF structure is disposed proximate the first RF structure to provide a fixed coupling ratio between the first RF structure and the second RF structure. The transition region can also be disposed on at least one of the first printed circuit board and the second printed circuit board.

In some embodiments, the first RF structure that can be matched to the microstrip transition areas, and is disposed in a second etchback area. The second RF structure can then be disposed proximate the first RF structure. In other embodiments, a stripline structure is used in which the first RF structure is continuous with microstrip transition areas. In this case, the first printed circuit board further comprises a second RF structure disposed proximate the first RF structure.

In still other embodiments, the second printed circuit board can include a first side contacting the first printed circuit board, a second side comprising a ground plane, and means for connecting disposed on the second side. The first printed circuit board can include a first side for contacting the first side of the second printed circuit board. The first side can comprise a ground plane, a plurality of microstrip transition areas, and the first etchback area.

Aspects of the present invention can also provide methods of assembling couplers in which a first printed circuit board can be provided, and then a second printed circuit board is surface mounted on the first printed circuit board to define a shielded region between the first printed circuit board and the second printed circuit board. The shielded region at least partly surrounds a coupler circuit disposed therein. A solder re-flow operation can then be performed to electrically and mechanically connect the first printed circuit board to the second printed circuit board to thereby provide a stripline structure.

Coupler assemblies according to aspects of the invention will now be discussed with reference to a base PCB such as that shown in FIG. 1 and a surface mountable PCB structure such as that shown in FIG. 2A and 2B. It will be appreciated that coupler assemblies according to aspects of the invention are not limited to the embodiments shown in the drawings.

Figure 4:
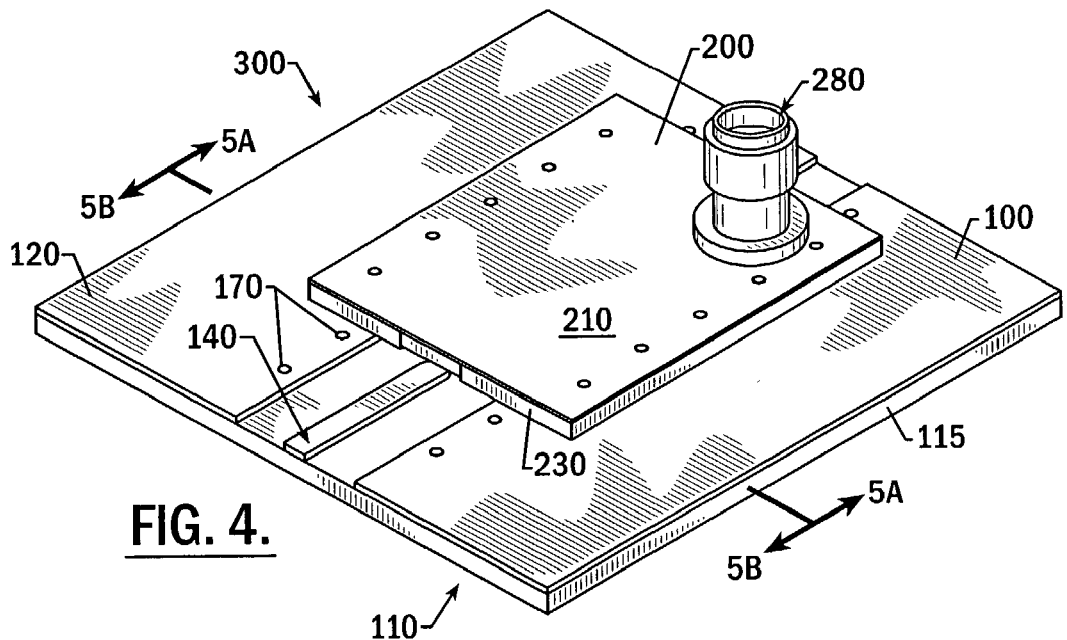
FIG. 4 illustrates an example of a stripline coupler structure resulting from assembly of the base PCB structure shown in FIG. 1 and the surface mountable PCB structure shown in FIG. 2 in which the base PCB structure shown in FIG. 1 is electrically and mechanically connected to the surface mountable PCB structure according to aspects of the present invention.

As shown in FIG. 4, the coupler assembly 300 can include a base printed circuit board 100 upon which a surface mount printed circuit board 200 is mounted and subsequently connected.

FIG. 1 illustrates an example of a base printed circuit board (PCB) structure 100 that can be used to implement aspects of the present invention.

When a single layer PCB is used for the base printed circuit board 100, the base printed circuit board 100 can include an insulator layer 115 and a patterned conductive layer 120 that is grounded. However, it should be appreciated that the base printed circuit board 100 can comprise either a single layer printed circuit board or a multiple layer printed circuit board.

The base printed circuit board 100 can include RF circuitry on the board 100. Other possible circuitry can include all printable topologies and components held only to the bounds of the physical property of the materials. For example, filters (planar and photonic band gap), detectors (all types), attenuators, and/or isolated "through wall" RF output (see copending U.S. application Ser. No. 10/103,277 entitled "A SYSTEM AND METHOD OF PROVIDING HIGHLY ISOLATED RADIO FREQUENCY INTERCONNECTIONS", which is incorporated by reference in its entirety herein).

The patterned conductive layer 120 is provided on a first face of the insulator layer 115. The patterned conductive layer 120 defines an etchback or gap region 190 therein that exposes a portion of the insulator layer 115. In a single layer configuration, the base printed circuit board 100 can include a dielectric layer 115 disposed between the first face 125 contacting the surface mount printed circuit board 200, and a second face 110 of the base printed circuit board 100.

Microstrip transition areas 140 can also be located on the first face 125. The microstrip transition areas 140 are preferably disposed in the first etchback area 190 for coupling to a main RF thru structure 240. The second face also includes a ground plane 110 that is coupled to the patterned conductive layer 120, for example, by wrapping around edge portions of base PCB 100.

The base PCB 100 can also include features required to accomodate mating components such as a clearance 150 adapted to accomodate a termination resistance 250, a clearance 160 adapted to accomodate a coupled port connector 280, and a plurality of connection points 170 provided in the conductive layer 120. The connection points 170 are sometimes referred to as "vias." The connection points or vias 170 can be disposed adjacent the etchback region 190. The connection points or vias 170 are disposed between the ground plane 110 and the patterned conductive layer 120, thus maintaining substantially equal electrical potential on both surfaces.

Figure 2A:
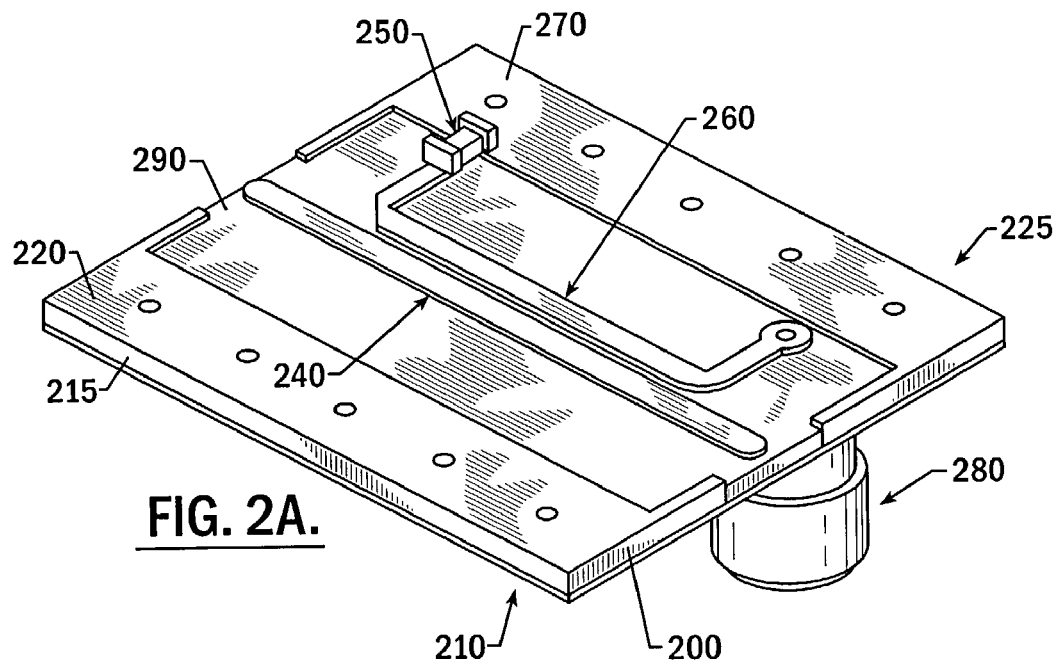
FIG. 2A illustrates bottom view of an example of a surface mountable PCB structure that can be used to implement other aspects of the present invention.

FIG. 2A illustrates bottom view of a surface mountable PCB 200 structure that can be used to implement other aspects of the present invention. When a single layer PCB is used, an insulator layer 215 is interposed between a patterned conductive layer 220 and a ground plane conductor layer 210. The insulator layer is typically a layer of dielectric material 215 interposed between a first ground plane 225 and a second ground conductor layer 210. The first ground plane 225 is typically coupled to the second ground conductor layer 210 via edge plating (not shown), plated throughholes (not shown) and the like.

The first face of the first ground plane 225 can include, for example, conductive tab regions 220, 270, a main RF thru structure 240, and a coupled RF structure 260. The conductive tab regions 220, 270 define a second etchback area 290 on a lower face or side of the surface mount printed circuit board 200. In the embodiment shown in FIG. 2A, the main RF thru structure 240 is disposed in the second etchback area 290. The main RF thru structure 240 is preferably matched for coupling to the microstrip transition areas 140. In other words, the main RF thru structure 240 is preferably constructed to have a strip width that will yield a desired characteristic impedance when separated from a ground plane by a dielectric sheet of a given thickness. Upon assembly, constructing the main RF thru structure 240 and the microstrip transition areas 140 in this manner will allow for a matched microstrip transmission line to be provided. To achieve matching, the width of the microstrip transition areas 140 may change as they pass under the surface mountable PCB 200 structure so that the width matches that of the main RF thru structure 240.

As noted above, the coupled RF structure 260 can also be disposed in the second etchback area 290 proximate the main RF thru structure 240. The coupled RF structure 260 is connected to the coupled port connector 280. The coupled radio frequency structure 260 can include, for example, a termination resistance 250.

Figure 2B:
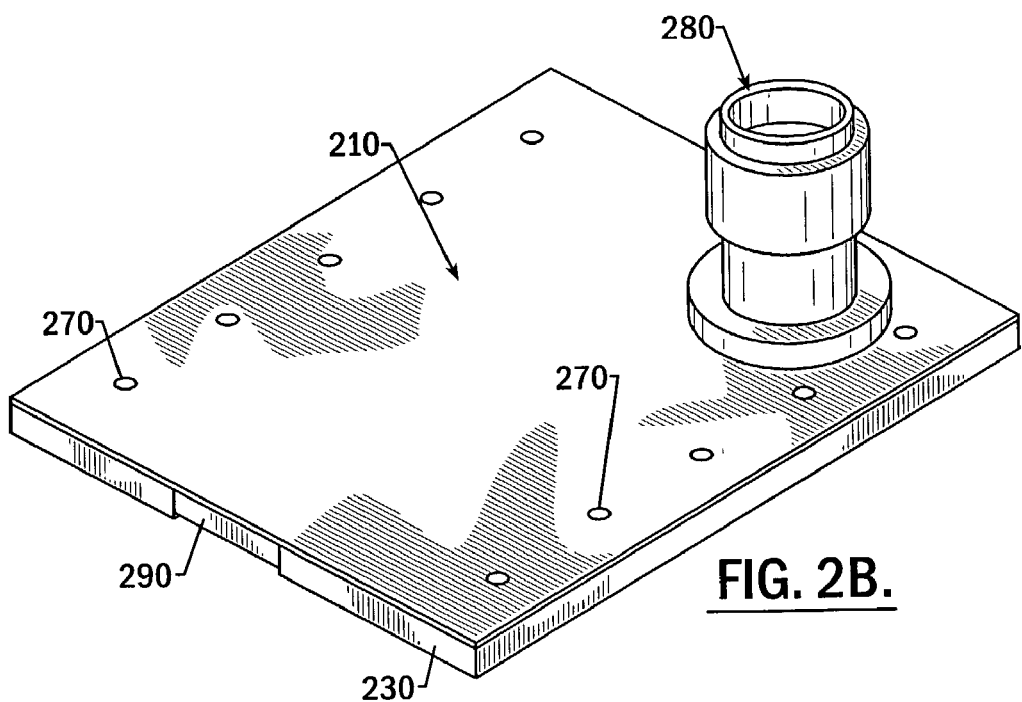
FIG. 2B illustrates top view of the surface mountable PCB structure shown in FIG. 2A.

FIG. 2B illustrates top view of the surface mountable PCB structure shown in FIG. 2A. As shown in FIG. 2B, a launch or coupled port connector 280 is provided to allow for connection to another circuit such as a power amplifier. The coupled port connector 280 can be disposed on the second face of the ground plane conductor layer 210. The PCB 200 can also provide features required for mating to the base PCB 100, such as connectivity points 270.

Figure 6:
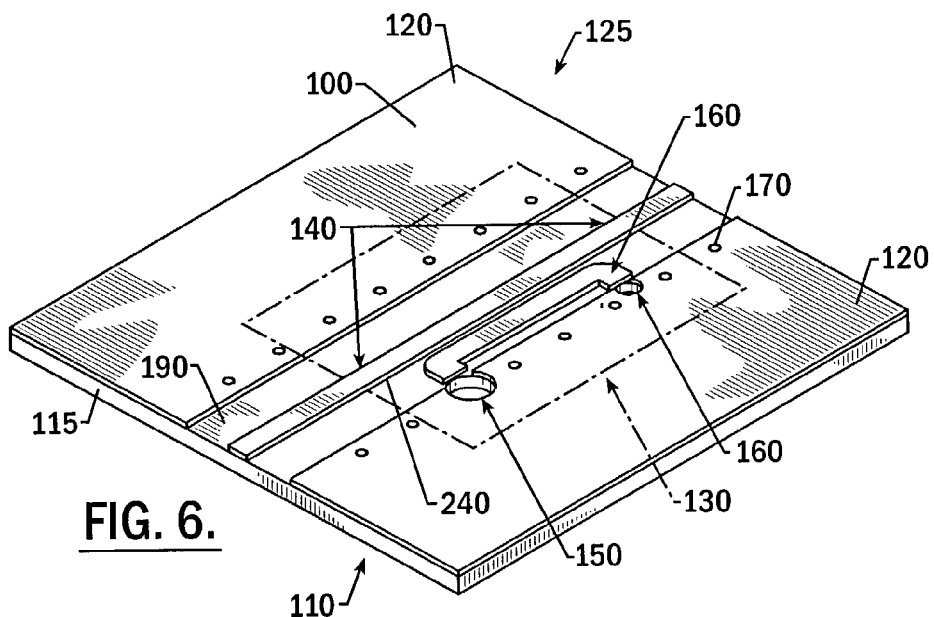
FIG. 6 illustrates another example of a base PCB structure that can be used to implement aspects of the present invention.
Figure 7:
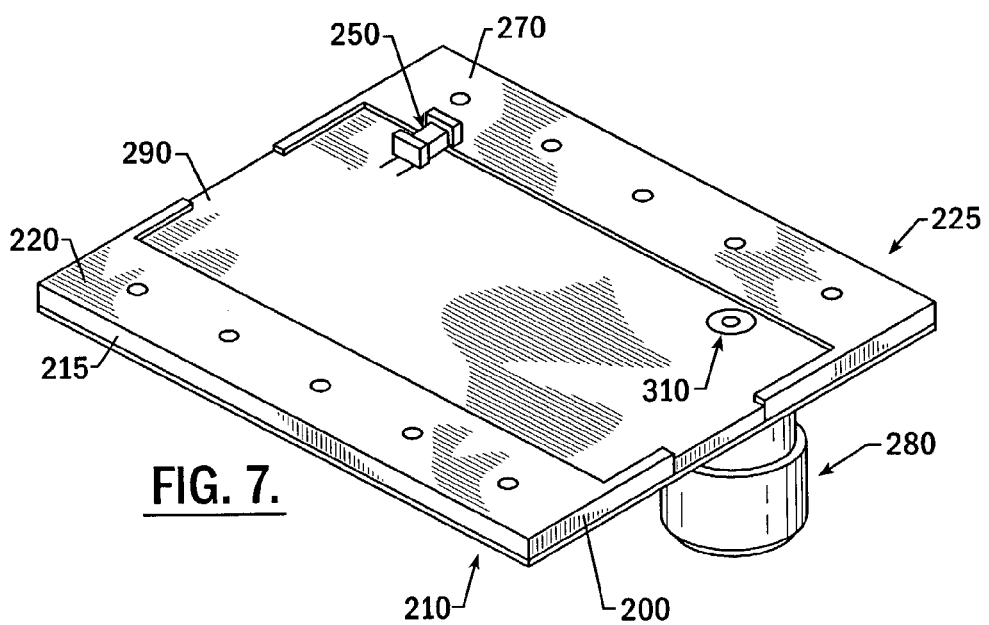
FIG. 7 illustrates another example of a surface mountable PCB structure that can be used to implement other aspects of the present invention.

In the embodiment shown in FIG. 2B, the surface mount printed circuit board 200 includes a main RF thru structure 240 coupled to the microstrip transition areas 140. The surface mount printed circuit board 200 also includes a coupled RF structure 260. The coupled RF structure is disposed proximate a main RF thru structure 240 such that a fixed coupling ratio is provided between the main RF thru structure 240 and the coupled RF structure 260. It should be appreciated that the main RF thru structure 240 and the coupled RF structure 260 could likewise be disposed on the base printed circuit board 100, as shown in FIGS. 6 and 7.

Thus, the surface mounted PCB 200 of the embodiment shown in FIG. 2B includes the coupler circuit structure 240, 260 including a termination port resistance 250, coupled port connector 280, and appropriate grounding 220 with connectivity points 270.

Figure 3:
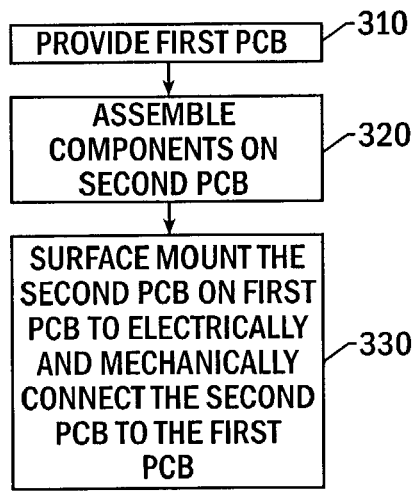
FIG. 3 is a flow chart illustrating a method of assembling a stripline coupler structure according to aspects of the present invention.

FIG. 3 is a flow chart illustrating a method of assembling a stripline coupler structure according to aspects of the present invention.

At step 310, a base printed circuit board 100 such as that discussed above is provided. The base printed circuit board includes conductive regions 120 that define a first etchback area 190 in which a plurality of microstrip transition areas 140 are provided.

At step 320, the surface mount printed circuit board 200 is mounted on the base printed circuit board 100 using conventional surface mount technology (SMT). The base printed circuit board 100 includes an outline 130 that serves as a target for placement of the first face 225 of the surface mount printed circuit board 200. The base printed circuit board 100 can also include a clearance 150 for accommodating the termination resistor 250, and a clearance 160 for accomodating the coupled port connector 280. The surface mount printed circuit board 200 also includes the second etch back area 290.

At step 330, a solder re-flow operation is performed that connects the base printed circuit board 100 to the surface mount printed circuit board 200. At least some of the plurality of connection points 170 are used during the solder reflow to establish a connection with the plurality of connection points 270 from through the surface mountable printed circuit board 200. As a result, during the solder reflow operation the two PCBs are electrically and mechanically connected, creating a stripline structure, as shown in FIG. 4.

FIG. 4 illustrates an example of the completed stripline coupler structure resulting from assembly of the base PCB structure shown in FIG. 1 and the surface mountable PCB structure shown in FIGS. 2A and 2B in which the base PCB structure shown in FIG. 1 is electrically and mechanically connected to the surface mountable PCB structure according to aspects of the present invention.

Figure 5A:
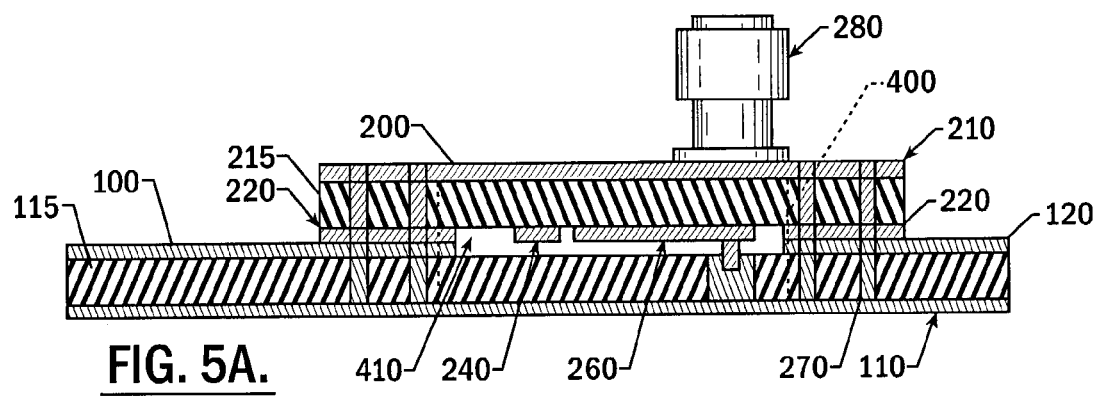
FIG. 5A illustrates a cross sectional view of the stripline coupler structure shown in FIG. 4, taken along line 5A—5A of FIG. 4.
Figure 5B:
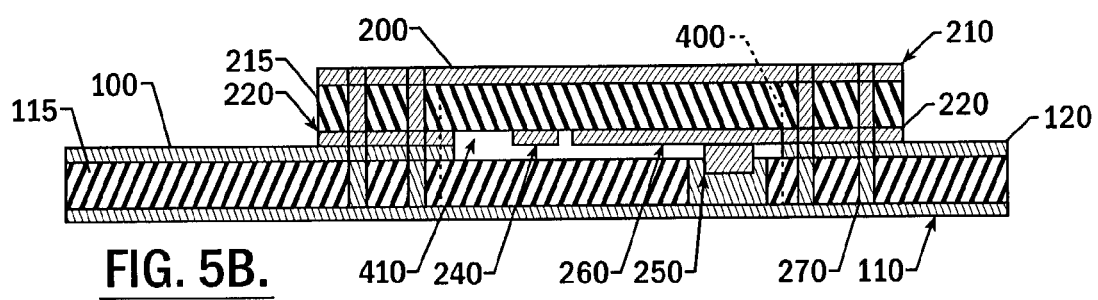
FIG. 5B illustrates a cross sectional view of the stripline coupler structure shown in FIG. 4, taken along line 5B—5B of FIG. 4.

FIG. 5A illustrates a cross sectional view of the stripline coupler structure shown in FIG. 4, taken along line 5A—5A of FIG. 4. FIG. 5B illustrates a cross sectional view of the stripline coupler structure shown in FIG. 4, taken along line 5B—5B of FIG. 4. Once assembled, the main RF thru structure 240 becomes a stripline conductor, and the coupler takes on a surface mount "stripline board" type structure. As noted above, those skilled in the art will realize that a strip transmission line is a conductor disposed between two ground planes, while a microstrip line is a conductor disposed above a single ground plane. Joining the main RF thru structure 240 to the microstrip transition areas 140 can provide the coupler circuit structure 240, 260 including a termination port resistance 250 and coupled port connector 280. A coupled RF structure 260 disposed proximate the main RF thru structure 240 can provide a coupler circuit having a fixed coupling ratio. The shielded region 400 between the surface mount printed circuit board 200 and the base printed circuit board 100 can be filled with air or other known dielectric materials.

In the completed coupler 300, the ground plane 120 of the base circuit board 100 and conductive tab regions 220 are electrically and mechanically connected. In turn, the ground plane 120 is electrically connected to the ground plane 210 of the surface mount circuit board 200. In the embodiment shown in FIG. 4, the ground planes 120, 210 are interconnected using connection points 170, 270. Such interconnections can be accomplished, for example, by using conductive through-holes such as those shown in FIGS. 5A and 5B.

By electrically and mechanically connecting the ground planes 120, 210 of the PCBs in a manner such that they surround the coupler circuit, a coupler circuit 240, 260 having a highly isolated stripline structure is provided within a shielded region 400 defined between the first etchback area 190 and the second etchback area 290. As noted above, the shielded region 400 is filled with insulative material 410 that comprises a dielectric such as glass teflon, glass epoxy, ceramic and the like. Alternative embodiments include dielectrics that are suitable for the construction of flexible PCBs.

Bringing a controlled impedance transmission line such as a stripline transmission line, through the shielded region can result in minimal disruption in its impedance. The shielded region 400 can thus serve to shield the coupler circuit, formed from the main RF thru structure 240 and the coupled RF structure 260, and thereby prevent the circuit from absorbing electromagnetic energy. Electromagnetic energy may be in the form of electromagnetic radiation that is typically impinging on the PCB 100, or that is generated by circuitry (not shown) disposed on PCB 100. The shielded region 400 can also prevent the coupler circuit from emitting electromagnetic energy.

As a result, compact, surface mount couplers can be provided that can provide a high degree of isolation. Such couplers are less costly than conventional "off-the-shelf" connectorized couplers and couplers implementing separate isolation walls soldered to the PCB. Such couplers can also provide a much more compact design in comparison to other RF couplers. In turn, possible integration options are greatly increased.

By replacing the PCB shown in FIG. 2A, the RF performance can be flexibly controlled based on the requirements of the user. Accordingly, such manufacturing flexibility can allow coupler values and frequencies to be optimized in situations in which couplers were mutually exclusive. This in turn can also allow for "PCB sharing."

The aspects of the present invention described above can have many practical variations. With the growing need of derivative products this design can be quickly conformed both in higher frequencies and coupling values. This can allow the coupler assemblies described above to be quickly conformed to higher frequencies. Moreover, this can also allow the coupler assemblies described above to be quickly conformed to other coupling values.

While aspects of the present invention have been described in terms of certain preferred embodiments, those of ordinary skill in the will appreciate that certain variations, extensions and modifications may be made without varying from the basic teachings of the present invention. For example, coupler assemblies according to aspects of the invention can utilize a base PCB such as that shown in FIG. 1 and a surface mountable PCB structure such as that shown in FIGS. 2A and 2B. It should be appreciated that while certain embodiments of the coupler assemblies can utilize a base PCB such as that shown in FIG. 1 and a surface mountable PCB structure such as that shown in FIG. 2B, the present invention is not limited to these particular embodiments. For example, FIG. 6 illustrates one example of alternative structures to the base PCB shown in FIG. 1 and FIG. 7 illustrates one example of alternative structures to the surface mountable PCB structure shown in FIG. 2, respectively. In such embodiments, the base printed circuit board 100 can include a main RF thru structure 240, and a coupled RF structure 260. The main RF thru structure 240 can disposed in the first etchback area 190. In this case, the main RF thru structure 240 is continuous with or part of the microstrip transition areas 140. The coupled RF structure 260 can also be disposed in the first etchback area 190 proximate the main RF thru structure 240. Thus, as shown in FIGS. 6 and 7, it will be appreciated that the main RF thru structure 240 and microstrip transition areas 140 could initially be provided in the first etchback area 190 and subsequently connected to a termination resistance 250 and annular ring structure 310 provided in the second etchback area 290.

Aspects of the present invention can be implemented, for example, on single layer printed circuit boards (PCBs) that can benefit from high isolation that stripline structures typically afford. Specialized circuit functions including RF power amplifiers are conventionally fabricated on PCB materials, including hard or brittle ceramic substrates, that are not compatible with multilayer PCB fabrication techniques. In the past, the inclusion of stripline as an inherent part of the unpopulated PCB has not been possible. In addition, single layer printed circuit boards (PCBs) may be useful where a connectorized coupler might not fit and/or needs to be removed. It should be appreciated that, the base PCB discussed herein could be either a single layer printed circuit board or a multiple layer printed circuit board.

As such, aspects of the present invention are not to be limited to the specific preferred embodiments described herein. Rather, the scope of the present invention is to be determined from the claims, which follow.

What is claimed is:

1. A coupler assembly comprising:
   a through structure, a coupled port, and an isolated port; and
   a first printed circuit board; and
   a second printed circuit board surface mounted on the first printed circuit board; and
   a shielded region defined between the first printed circuit board and the second printed circuit board, wherein the shielded region at least partly surrounds a multi-element intralayer coupler circuit disposed therein.

2. A coupler assembly according to claim 1, wherein
   the first printed circuit board includes a first etchback area,
   the second printed circuit board includes a second etchback area,
   the shielded region is defined between the first etchback area and the second etchback area, and
   the shielded region at least partly surrounds the coupler circuit disposed in at least one of the first etchback area and the second etchback area.

3. A coupler assembly according to claim 2, wherein the coupler circuit comprises:
   a first RF structure on a least one of the first printed circuit board and the second printed circuit board;
   a second RF structure disposed proximate the first RF structure on at least one of the first printed circuit board and the second printed circuit board, wherein the second RF structure is coupled to the first RF structure; and
   a transition region on at least one of the first printed circuit board and the second printed circuit board.

4. A coupler assembly according to claim 2, wherein the second printed circuit board includes:
   a first RF structure disposed in a second etchback area, wherein the first RF structure is matched to microstrip transition areas; and
   a second RF structure disposed proximate the first RF structure.

5. A coupler assembly according to claim 2, wherein a first RF structure is continuous with microstrip transition areas, and wherein the first printed circuit board further comprises:
   a second RF structure disposed proximate the first RF structure.

6. A coupler assembly according to claim 1, wherein a second RF structure is disposed proximate the first RF structure such that the first RF structure and the second RF structure maintain a fixed coupling ratio therebetween.

7. A coupler assembly according to claim 1, wherein the shielded region is at least partly filled with a dielectric material.

8. A coupler assembly according to claim 1, wherein the second printed circuit board includes:
a first side contacting the first printed circuit board;
a second side comprising a ground plane; and
means for connecting disposed on the second side.

9. A coupler assembly according to claim 1, wherein the first printed circuit board includes a first side contacting the first side of the second printed circuit board, wherein the first side of the first printed circuit board comprises a ground plane, a plurality of microstrip transition areas, and a first etchback area.

10. A coupler assembly comprising:
a through structure, a coupled port, and an isolated port; and
a first printed circuit board including a plurality of microstrip transition areas disposed in a first etchback area; and
a second printed circuit board having a second etchback area, and coupled to the first printed circuit board;
wherein at least one of the first printed circuit board and the second printed circuit board includes:
a first RF structure coupled to the microstrip transition area,
a second RF structure disposed proximate to and within the same layer as the first RF structure, the first and second RF structures comprising an RF coupler circuit,
wherein a shielded region is defined between the first etchback area and the second etchback area.

11. A coupler assembly according to claim 10, wherein the second printed circuit board includes:
the first RF structure disposed in a second etchback area, wherein the first RF structure is matched to the microstrip transition areas; and
the second RF structure disposed proximate the first RF structure.

12. A coupler assembly according to claim 10, wherein the first RF structure is continuous with the microstrip transition areas, wherein the first printed circuit board further comprises:
the second RF structure disposed proximate the first RF structure.

13. A coupler assembly according to claim 10, wherein the second RF structure is disposed proximate the first RF structure such that the first RF structure and the second RF structure maintain a fixed coupling ratio therebetween.

14. A coupler assembly according to claim 10, wherein the shielded region is filled with a dielectric material.

15. A coupler assembly according to claim 10, wherein the second printed circuit board includes:
a first side contacting the first printed circuit board;
a second side comprising a ground plane; and
means for connecting disposed on the second side.

16. A coupler assembly according to claim 10, wherein the first printed circuit board includes a first side contacting the first side of the second printed circuit board, wherein the first side comprises a ground plane, the plurality of microstrip transition areas, and the first etchback area.

17. A coupler assembly comprising:
a through structure, a coupled port, and an isolated port; and
a base printed circuit board including conductive regions that define a first etchback area, wherein a plurality of microstrip transition areas are disposed in the first etchback area; and
a surface mount printed circuit board having a second etch back area coupled to the base printed circuit board,
wherein at least one of the base printed circuit board and the surface mount printed circuit board includes:
a main RF thru structure coupled to the microstrip transition areas; and
a coupled RF structure disposed proximate to and within the same layer as the main RF thru structure such that a fixed coupling ratio is provided between the main RF thru structure and the coupled RF structure.

18. A coupler assembly according to claim 17, wherein the surface mount printed circuit board includes:
conductive tab regions defining the second etchback area on a lower face of the surface mount printed circuit board;
the main RF thru structure disposed in the second etchback area, wherein the main RF thru structure is matched to the microstirp transition areas; and
the coupled RF structure disposed in the second etchback area proximate the main RF thru structure.

19. A coupler assembly according to claim 17, wherein the base printed circuit board includes:
the main RF thru structure disposed in the first etchback area, wherein the main RF thru structure is continuous with the microstrip transition areas; and
the coupled RF structure disposed in the first etchback area proximate the main RF thru structure.

20. A coupler assembly according to claim 17, wherein a shielded region is defined between the first etchback area and the second etchback area.

21. A coupler assembly according to claim 17, wherein the shielded region is filled with insulative material.

22. A coupler assembly according to claim 17, wherein the surface mount printed circuit board includes:
a first face contacting the base printed circuit board;
a second face comprising a ground plane; and
means for connecting disposed on the second face.

23. A coupler assembly according to claim 17, wherein the base printed circuit board includes a first face contacting the first face of the surface mount printed circuit board, wherein the first face comprises a ground plane, the plurality of microstrip transition areas, and the first etchback area.

24. A coupler assembly according to claim 17, wherein the base printed circuit board includes RF circuitry thereon.

25. A coupler assembly according to claim 17, wherein the base printed circuit board comprises a single layer printed circuit board.

26. A coupler assembly according to claim 17, wherein the base printed circuit board comprises a multiple layer printed circuit board.

* * * * *